United States Patent [19]
Kawahara et al.

[11] Patent Number: 5,539,700
[45] Date of Patent: Jul. 23, 1996

[54] COLUMN SELECTION CIRCUIT OF SEMICONDUCTOR MEMORY WITH TRANSFER GATE

[75] Inventors: Akifumi Kawahara, Moriguchi; Toshiki Mori, Ibaraki, both of Japan

[73] Assignee: Matsushita Electric Industrial Co., Ltd., Osaka, Japan

[21] Appl. No.: 489,776

[22] Filed: Jun. 13, 1995

Related U.S. Application Data

[63] Continuation of Ser. No. 149,566, Nov. 9, 1993, abandoned.

[30] Foreign Application Priority Data

Nov. 10, 1992 [JP] Japan ................................ 4-299483

[51] Int. Cl.⁶ ........................................................ G11C 7/00
[52] U.S. Cl. ................ 365/203; 365/190; 365/205; 365/208; 365/189.09; 365/189.11
[58] Field of Search ....................... 365/203, 207, 365/208, 190, 189.09, 189.11, 205

[56] References Cited

U.S. PATENT DOCUMENTS

| | | | |
|---|---|---|---|
| 4,123,799 | 10/1978 | Peterson . | |
| 4,879,682 | 11/1989 | Engles | 365/203 |
| 4,926,382 | 5/1990 | Sakui et al. | 365/208 |
| 5,043,945 | 8/1991 | Bader | 365/190 |
| 5,058,072 | 10/1991 | Kashimura | 365/189.11 |
| 5,091,888 | 2/1992 | Akaogi | 365/189.09 |
| 5,132,936 | 7/1992 | Keswick et al. | 365/203 |
| 5,157,631 | 10/1992 | Shimogawa | 365/208 |
| 5,233,558 | 8/1993 | Fujii et al. | 365/203 |
| 5,255,233 | 10/1993 | Izumi | 365/189.09 |
| 5,267,207 | 11/1993 | Jinbo | 365/203 |
| 5,274,590 | 12/1993 | Kashimura | 365/189.09 |

FOREIGN PATENT DOCUMENTS 2-310895  12/1990  Japan .

*Primary Examiner*—Joseph E. Clawson, Jr.
*Attorney, Agent, or Firm*—Wenderoth, Lind & Ponack

[57] ABSTRACT

A column selection circuit of a semiconductor memory includes a plurality of transfer gates each of which is arranged between each sense amplifier and each column select gate for gating each column to an internal bus according to a difference between a potential of each bit line and a precharge potential of each data bus.

4 Claims, 5 Drawing Sheets

COLUMN SELECTION CIRCUIT OF SEMICONDUCTOR MEMORY WITH TRANSFER GATE

This application is a continuation of now abandoned application Ser. No. 08/149,566, filed Nov. 9, 1993.

BACKGROUND OF THE INVENTION

1. Field of the Invention

The present invention relates to a column selection circuit of a semiconductor memory such as a DRAM, VRAM or the like which enables high speed reading.

2. Description of the Related Art

As shown schematically in FIG. 3, a conventional column selection circuit of a semiconductor memory is comprised of a column decoder 4 to which a column address signal COL is input and a plurality of column select gate pairs 5-1 and 5-2 (only one pair is shown in FIG. 3) for connecting a pair of bit lines B and $\overline{B}$ forming a column, when selected by the column decoder 4, to a pair of internal bus lines D and $\overline{D}$. Bit lines B and $\overline{B}$ and internal bus lines D and $\overline{D}$ are precharged at a predetermined potential $V_{Bp}$ which is set between low and high potentials.

The reading operation of data stored in a memory cell will be explained referring to FIG. 4.

When a row address signal ROW is applied to a row decoder 2 at timing T7, a word line WL becomes high at timing T8 and information stored in the memory cell 1 appears as a small differential potential between bit lines B and $\overline{B}$. A sense amplifier 3 connected between bit lines B and $\overline{B}$ is driven by a sense amplifier driving signal SADR at timing T9 to amplify potentials of bit lines B and $\overline{B}$. These potentials of bit lines B and $\overline{B}$ are amplified to "high" and "low" due to an amplifying operation of the sense amplifier 3, respectively but potentials of internal bus lines are kept at the precharged potential in this stage.

Next, restriction on the timing of a column address signal COL is explained referring to FIG. 5. As shown in FIG. 5, a minimum time interval between drops of $\overline{RAS}$ and $\overline{CAS}$ which are external control signals for the memory is regulated by tRCD (RAS -CAS delay). Since sense amplifier driving signal SADR is generated by delaying $\overline{RAS}$, column address signal COL may be fetched into before driving the sense amplifier by sense amplifier driving signal SADR if tRCD is minimum. However, if column select gates 5-1 and 5-2 are opened at a timing earlier than a start of the drive operation by the sense amplifier 3, a differential potential between bit lines B and $\overline{B}$ becomes smaller than the initial differential potential since stray capacitances of internal bus lines D and $\overline{D}$ are usually far larger than those of bit lines B and $\overline{B}$ and, accordingly, potentials of bit lines B and $\overline{B}$ are not amplified effectively. In order to avoid this problem, time margin t1 is defined so that a column address signal COL is applied to open column select gates 5-1 and 5-2 after a differential potential between bit lines B and $\overline{B}$ becomes reasonably large due to an amplifying operation of the sense amplifier.

Returning to FIG. 4, when a column address signal COL is input to column decoder 4 at timing T10, column select gates 5-1 and 5-2 are opened to connect bit lines B and $\overline{B}$ to internal data bus lines D and $\overline{D}$, respectively.

Thereafter, potentials of bit lines B and $\overline{B}$ and internal data bus lines D and $\overline{D}$ are amplified to high and low potentials by sense amplifier 3, respectively, and thereby, one reading operation from memory cell 1 to internal data bus D and $\overline{D}$ is completed.

In the composition of the conventional column selection circuit, the column selection operation can not be carried out at an earlier timing since a time margin t1 is needed as mentioned above.

Further, if a noise signal is applied to bit lines B and $\overline{B}$ before the differential potential therebetween is amplified to a reasonably large value, potentials of bit lines B and $\overline{B}$ become close to each other as indicated by a small circle in FIG. 4, resulting in an error operation and/or delay of amplification operation by the sense amplifier. Also, since faculty of the sense amplifier temporarily decreases due to reduction of the differential potential between bit lines B and $\overline{B}$, charge and discharge of the internal data bus lines D and $\overline{D}$ are slowed down resulting in substantial restrictions to the realization of a stable and high speed reading operation.

SUMMARY OF THE INVENTION

An object of the present invention is to provide a column selection circuit of a semiconductor memory wheel is capable of starting a column selection at an earlier timing without need of any time margin.

Another object of the present invention is to provide a column selection circuit of a semiconductor memory which is capable of providing a stable column selection operation even if it is started at an earlier timing.

A further object of the present invention is to provide a semiconductor memory which is capable of high speed reading out of data stored therein.

In order to achieve these objects, according to the present invention, there is provided a column selection circuit of a semiconductor memory comprising a plurality of bit line pairs each of which is connected to a sense amplifier, a bit line precharger for precharging each bit line pair at a predetermined potential, an internal data bus for transmitting data to be written into or read out from respective memory cells, a data line precharger for precharging said internal data bus at said predetermined potential, at least one column decoder for decoding a column select signal input thereinto to select a column among a plurality of columns, a plurality of column select gate means each of which connects a column, when selected by said column decoder, to said internal data bus, and a plurality of transfer gate means each of which is arranged between each sense amplifier and each column select gate means for controlling a current of each bit line according to a difference between a potential of each bit line and said predetermined potential.

In operation of the column selection circuit, when a differential potential between bit lines becomes large according to an amplification operation of the sense amplifier, bit lines are automatically connected to the internal data bus, and no time margins for delaying start of column selection are needed.

Further, since bit lines are kept disconnected to internal data bus lines even if the column selecting operation by the column decoder is started before sense amplification by the sense amplifier, the sense amplification can be stably carried out without being affected by large inherent capacitances of the internal data bus and, since the bit lines are connected to the internal data bus lines after a differential potential between the bit lines has been amplified to a value sufficient for preventing potentials of bit lines from drawing back near the precharge potential.

BRIEF DESCRIPTION OF THE DRAWINGS

These and other objects and features of the present invention will become clear from the following description taken in conjunction with the preferred embodiments thereof with reference to the accompanying drawings throughout which like parts are indicated by like reference numerals, and in which.

DETAILED DESCRIPTION OF THE PREFERRED EMBODIMENTS

Figure 1:
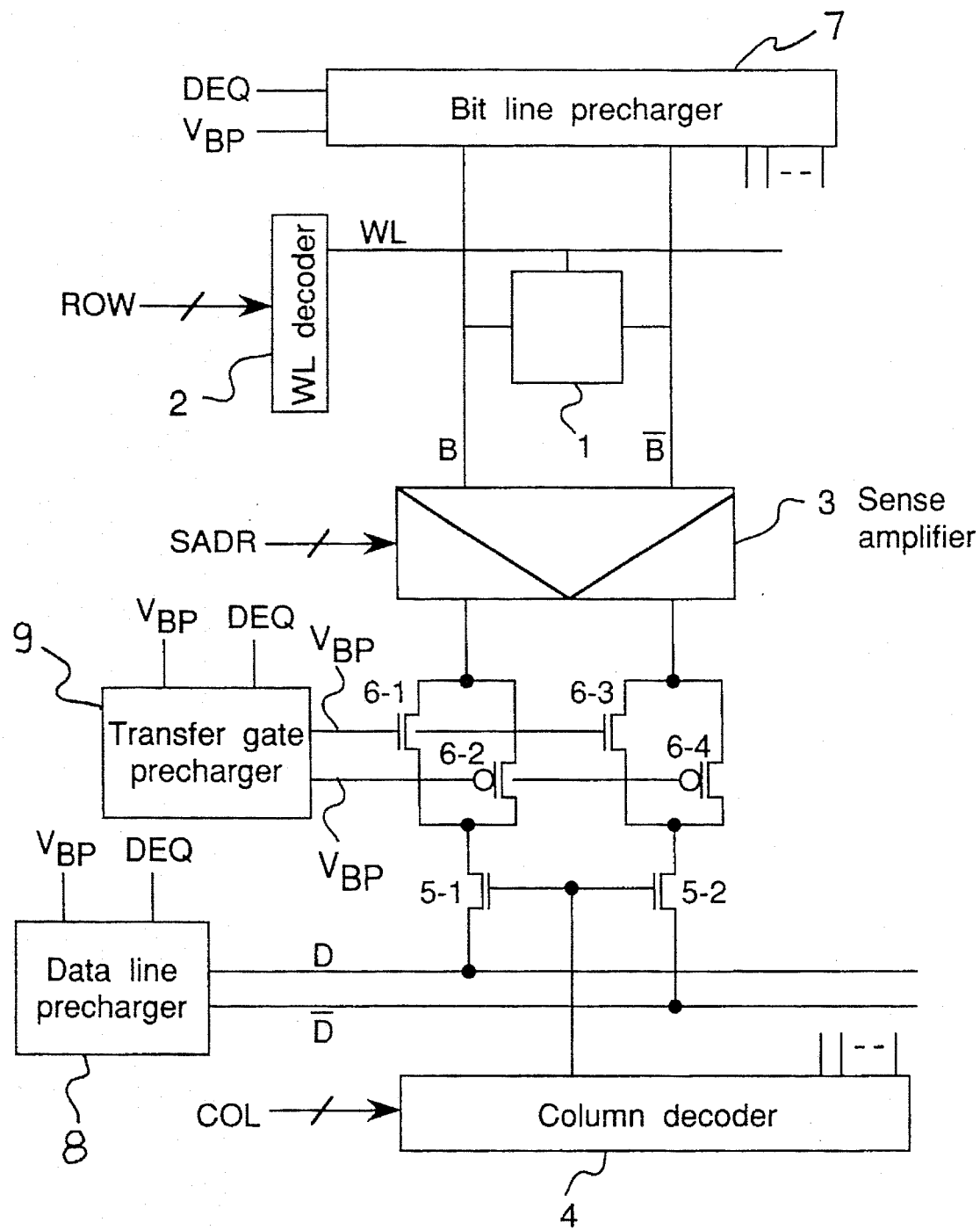
FIG. 1 isle schematic diagram of a part of a semiconductor memory including a column selection circuit according to the present invention.

FIG. 1 shows a column selection circuit of a semiconductor memory according to a preferred embodiment of the present invention.

As shown in FIG. 1, a memory cell 1 for storing one bit data is connected to a word line WL and a pair of bit lines B and $\bar{B}$. The word line WL is enabled by a row decoder 2 to which a row address signal ROW is input. Between the pair of bit lines B and $\bar{B}$, a sense amplifier 3 is connected. This sense amplifier 3 is driven by a sense amplifier driving signal SADR when applied thereto. The bit line B is connected to an internal data bus line D via a transfer gate comprising two complementary transistors 6-1 and 6-2 and a column selection gate 5-1, and another bit line $\bar{B}$ is connected to another internal data bus line $\bar{D}$ via another transfer gate comprising two complementary transistors 6-3 and 6-4 and another column selection gate 5-2. These column selection gates 5-1 and 5-2 are turned on and off by a column decoder 4 to which a column address signal COL is input.

The bit lines B and $\bar{B}$ are precharged at a predetermined potential $V_{Bp}$ set at one half of a source potential $V_{cc}$ by a bit line precharger 7 and internal data bus lines D and $\bar{D}$ are also precharged at $V_{Bp}$ by an internal data bus line precharger 8. Further, respective gates of transistors 6-1, 6-2, 6-3 and 6-4 are also precharged at $V_{Bp}$ by a transfer gate precharger 9.

Figure 2:
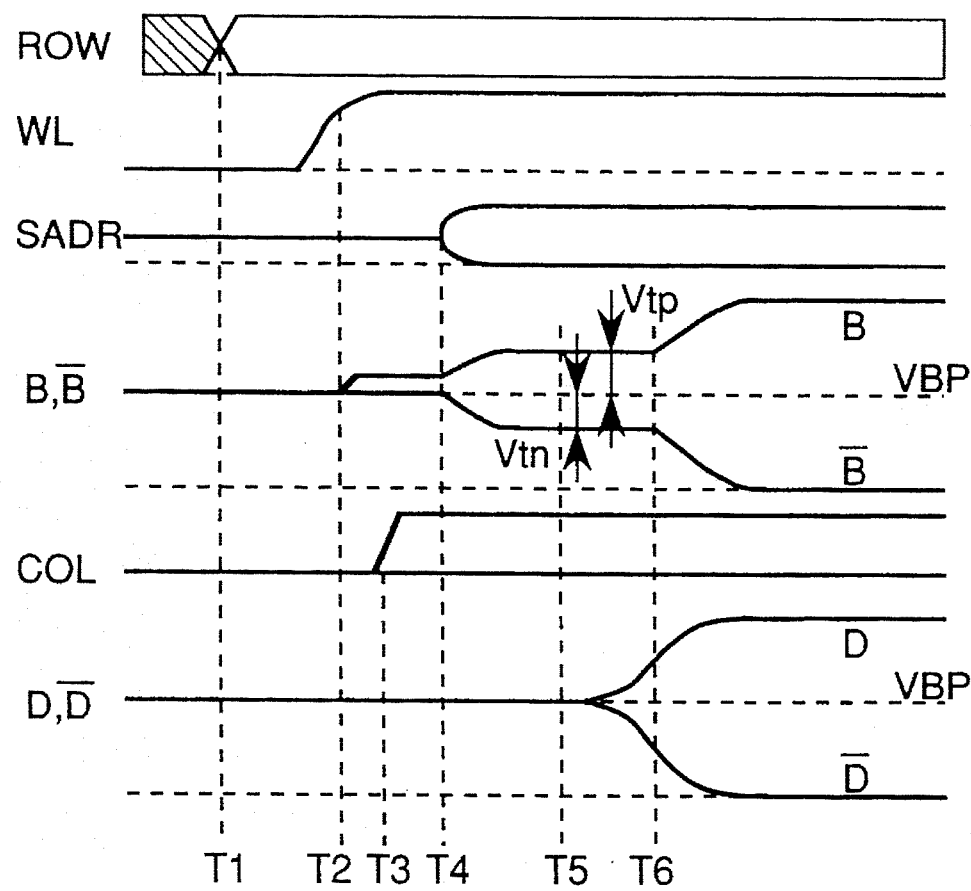
FIG. 2 is a timing chart for showing an operation of the column selection circuit shown in FIG. 1.
Figure 3:
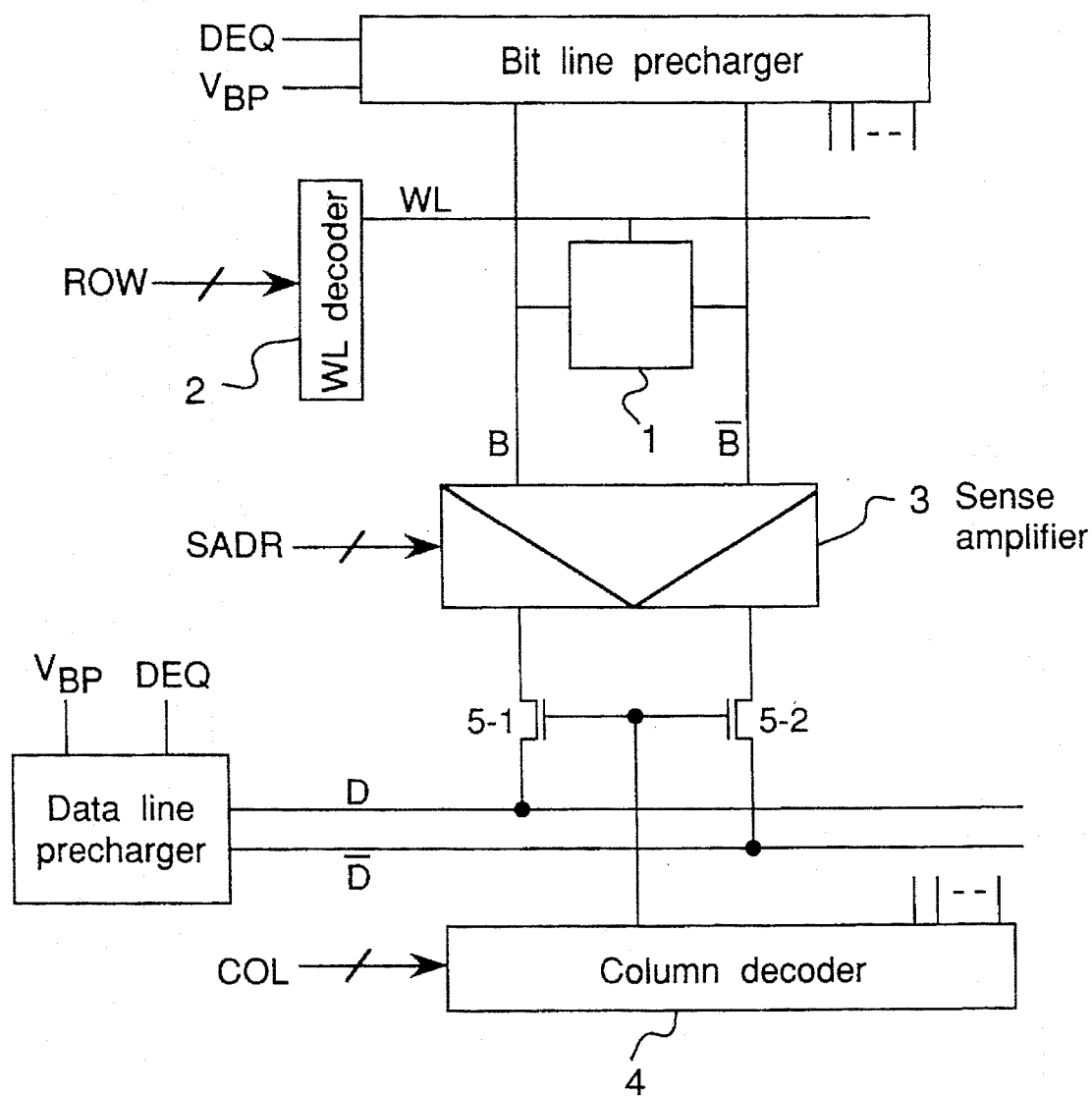
FIG. 3 is a schematic diagram of a part of semiconductor memory including a conventional column selection circuit.
Figure 4:
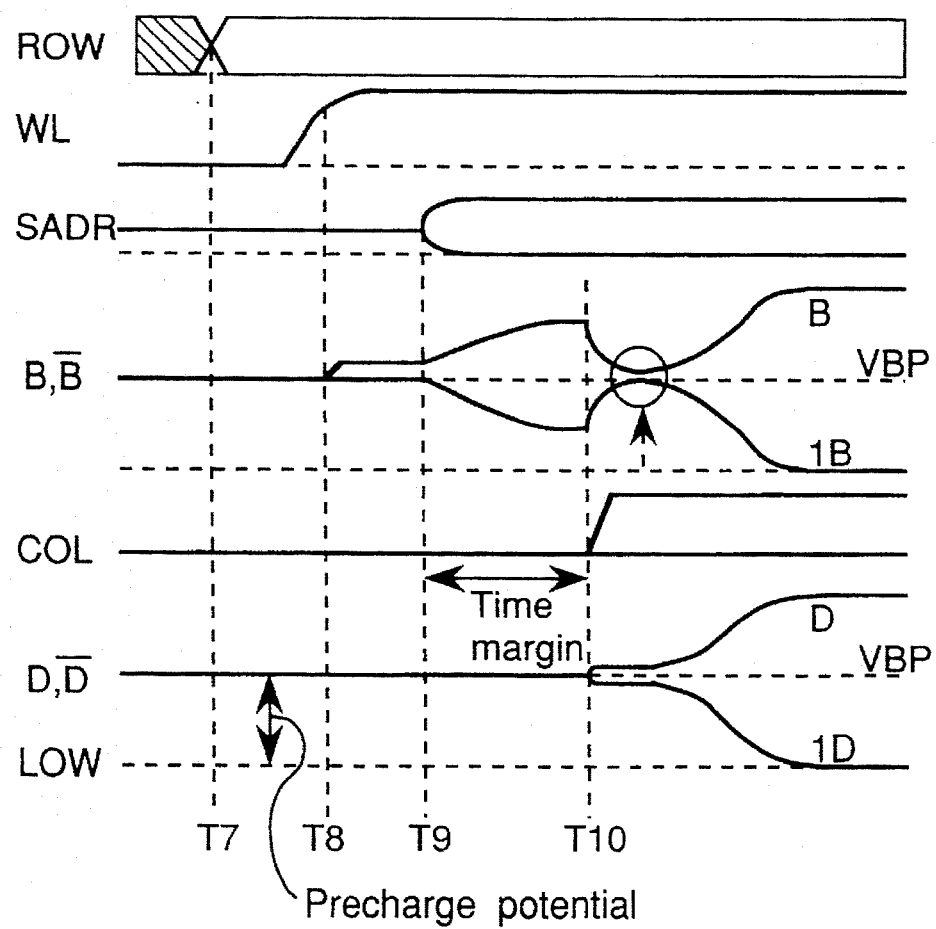
FIG. 4 is a timing chart for showing an operation of the conventional column selection circuit shown in FIG. 3.
Figure 5:
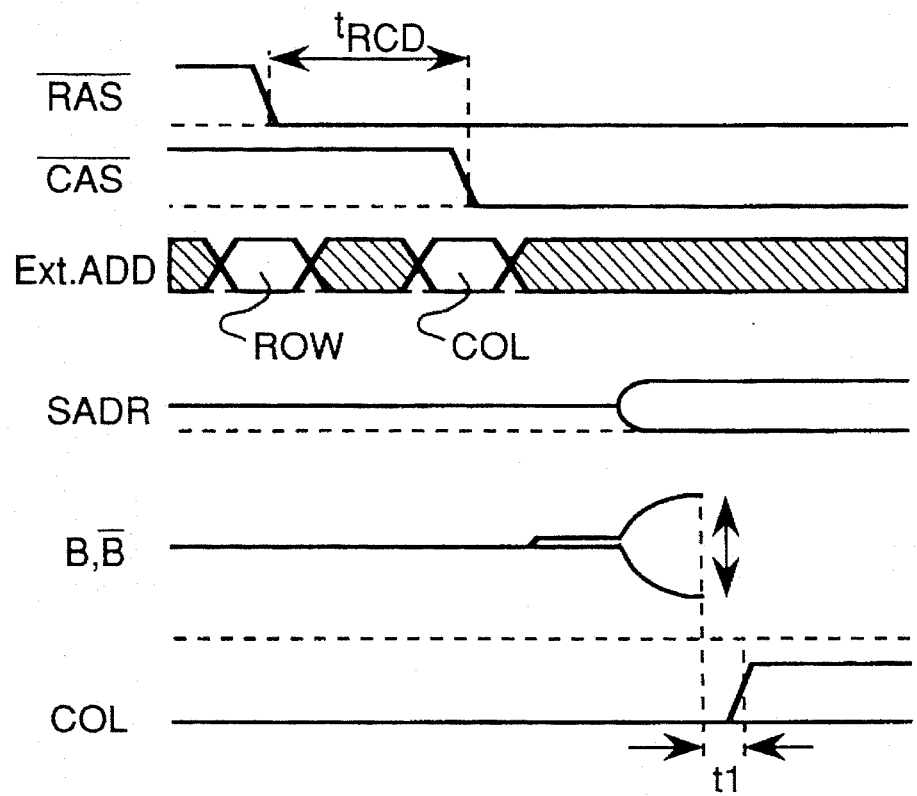
FIG. 5 is a timing chart for showing restrictions on a column selection timing of the conventional column selection circuit.

Next, a reading out operation of information stored in the memory cell 1 is explained referring to FIG. 2 showing a timing chart of the column selection circuit.

At first, a row address signal ROW is input to the row decoder 2 at timing T1. Then, the word line WL selected by the row decoder 2 becomes "high" and bit data stored in the memory cell 1 is output as a small differential potential between bit lines B and $\bar{B}$ at timing T2. When a column address signal COL is input to column decoder 4 at timing T3, two column select gates 5-1 and 5-2 are turned on (opened). Even if the column address signal COL is input to the column decoder 4 prior to input of a sense amplifier driving signal SADR to the sense amplifier 4, bit lines B and $\bar{B}$ and internal data bus lines D and $\bar{D}$ are kept at a potential equal to or near the precharge potential $V_{Bp}$ and, accordingly, all of complementary transistors 6-1, 6-2, 6-3 and 6-4 are kept in an off state. Thus, the bit lines B and $\bar{B}$ are not connected to the internal data bus lines D and $\bar{D}$ at this stage.

Then, a sense amplifier driving signal SADR is applied to sense amplifier 3 to drive the same thereby starting amplification of potentials of bit lines B and $\bar{B}$ and reading out of data to internal data bus lines D and $\bar{D}$.

Assuming a threshold potential of each of n-type transistors 6-1 and 6-3 is $V_{tn}$ and that of each of p-type transistors 6-2 and 6-4 is $V_{tp}$, changes in potentials on the high side signal lines B and D and those on the low side signal lines $\bar{B}$ and $\bar{D}$ are explained next.

The potential of bit line B at the high side is raised by the sense amplifier 3 from timing T4 but transfer gates 6-1 and 6-2 are kept closed so that the internal data bus line D is kept at the intermediate potential. When the potential of bit line B is raised up to $(V_{Bp}+V_{tp})$ at timing T5, gate 6-2 is opened and, thereby, the internal data bus line D is charged to raise the potential thereof, but the potential of bit line B is kept constant until it becomes equal to the potential of the internal data bus line D. When the potential of the internal data bus line D is raised up to that of the bit line B at timing T6, both potentials are raised up to a level of a source power.

The potential of bit line $\bar{B}$ at the low side is dropped by sense amplifier 3 at timing T4, and complementary transistors 6-3 and 6-4 are kept closed thereby maintaining the potential of the internal data bus line at the precharge potential $V_{Bp}$. When the potential of bit line $\bar{B}$ drops to $(V_{Bp}-V_{tn})$ at timing T5, the gate 6-3 is opened and, thereby, the potential of internal data bus line $\bar{D}$ is dropped until it becomes equal to the potential of bit line $\bar{B}$. Then both potentials of bit line $\bar{B}$ and internal data bus line $\bar{D}$ fall down to a ground or low level.

As stated above, a time margin for delaying application timing of a column address signal to the column decoder can be omitted since selected bit lines are automatically connected to the internal data bus lines only when a differential potential between selected bit lines is amplified to a magnitude sufficient for preventing potentials of selected bit lines from dropping due to a large inherent capacitance of each internal data bus line.

Further, a stable amplification operation of the sense amplifier can be assured without being affected by the internal data bus since bit lines are kept disconnected to the internal data bus even if column selection is performed before the differential potential between bit lines is amplified up to a sufficient magnitude.

Also, high-speed reading out of information in a semiconductor memory can be realized since the amplifying ability of the sense amplifier can be maintained in a high level due to a lack of drop in the differential potential.

Although the present invention has been fully described in connection with the preferred embodiments thereof with reference to the accompanying drawings, it is apparent to those skilled in the art. Such changes and modifications are to be understood as included within the scope of the present invention as defined by the appended claims unless they depart therefrom.

What is claimed is:

1. A column selection circuit of a semiconductor memory comprising:
   a plurality of memory cells;
   a plurality of bit line pairs respectively connected to said plurality of memory cells;
   a bit line precharger, connected to said plurality of bit line pairs, for precharger each of said plurality of bit line pairs at a predetermined potential which is intermediate a predetermined logic high potential and a predetermined logic low potential;

an internal data bus for transmitting data to be written into or read out from said plurality of memory cells;

a data line precharger, connected to said internal data bus, for precharging said internal data bus at a potential equal to said predetermined potential;

a plurality of sense amplifiers, respectively connected to said plurality of bit line pairs, which respectively amplify a difference between potentials of bit lines of said plurality of bit line pairs;

a plurality of transfer gate means, respectively connected to said plurality of sense amplifiers such that said plurality of sense amplifiers are respectively connected between said plurality of bit line pairs and said plurality of transfer gate means, for controlling an output current of each respective sense amplifier according to a difference between an output potential of each respective sense amplifier and said predetermined potential of said internal data bus, each of said plurality of transfer gate means including at least one gate which is maintained at said predetermined potential so as to set each transfer gate means in a normally closed state;

at least one column decoder for decoding a column address signal input thereto to select a column among a plurality of columns; and a plurality of column select gate means which are respectively controlled by corresponding outputs of said column decoder and which are respectively connected to and between said plurality of transfer gate means and said internal data bus such that said plurality of transfer gate means are respectively connected between said plurality of sense amplifiers and said plurality of column select gate means, wherein each transfer gate means is opened when a potential of a corresponding bit line differs from said predetermined potential by at least one second predetermined potential so as to connect said corresponding bit line to said internal bus through a respective column select gate means.

2. The column selection circuit according to claim 1, wherein each of said transfer gate means is comprised of a pair of complementary transistors and wherein said column selection circuit further includes a transfer gate precharger for precharging a gate of each of said complementary transistors to said predetermined potential, and wherein said at least one second predetermined potential is a threshold voltage of each of said complementary transistors.

3. The column selection circuit according to claim 2, wherein each of said plurality of column select gate means is for controlling a connection between a respective transfer gate means and said internal data bus.

4. The column selection circuit according to claim 1, wherein each of said plurality of column select gate means is for controlling a connection between a respective transfer gate means and said internal data bus.

* * * * *